United States Patent
Harada et al.

(10) Patent No.: US 9,041,271 B2
(45) Date of Patent: May 26, 2015

(54) CRYSTAL DEVICE

(75) Inventors: Masakazu Harada, Saitama (JP); Takumi Ariji, Saitama (JP); Takehiro Takahashi, Saitama (JP)

(73) Assignee: NIHON DEMPA KOGYO CO., LTD, Tokyo (JP)

( * ) Notice: Subject to any disclaimer, the term of this patent is extended or adjusted under 35 U.S.C. 154(b) by 476 days.

(21) Appl. No.: 13/490,474

(22) Filed: Jun. 7, 2012

(65) Prior Publication Data

US 2012/0313488 A1    Dec. 13, 2012

(30) Foreign Application Priority Data

Jun. 8, 2011 (JP) ................... 2011-128023
Jun. 5, 2012 (JP) ................... 2012-127725

(51) Int. Cl.
*H01L 41/09* (2006.01)
*H03H 3/02* (2006.01)
*H03H 9/10* (2006.01)
*H03H 9/17* (2006.01)

(52) U.S. Cl.
CPC ............... *H03H 3/02* (2013.01); *H03H 9/105* (2013.01); *H03H 9/177* (2013.01); *H03H 2003/028* (2013.01)

(58) Field of Classification Search
USPC ............ 310/340, 344, 346, 348, 360–362
See application file for complete search history.

(56) References Cited

U.S. PATENT DOCUMENTS

| 7,012,355 | B2 | 3/2006 | Oda et al. | |
| 7,564,177 | B2* | 7/2009 | Yoshimatsu et al. | 310/365 |
| 2008/0079334 | A1 | 4/2008 | Yong et al. | |
| 2009/0096329 | A1* | 4/2009 | Ono et al. | 310/348 |
| 2010/0171397 | A1 | 7/2010 | Yamada | |
| 2012/0068578 | A1* | 3/2012 | Takahashi | 310/344 |
| 2012/0217846 | A1* | 8/2012 | Takahashi | 310/346 |

FOREIGN PATENT DOCUMENTS

| JP | 2008-259041 | 10/2008 |
| WO | 2010119724 | 10/2010 |

* cited by examiner

*Primary Examiner* — Thomas Dougherty
(74) *Attorney, Agent, or Firm* — Jianq Chyun IP Office

(57) ABSTRACT

A crystal device is provided, in which a peeling of a bonding material is prevented by using the bonding material having a thermal expansion coefficient which is between the coefficients in a first direction and a second direction of a bonding surface of a crystal element. A crystal device includes a rectangular crystal element formed with a crystal material that includes an excitation part and a frame surrounding the excitation part. The device further includes a rectangular base bonded to a principal surface of the frame, and a lid bonded to another principal surface of the frame; and the frame, the base and the lid have edges respectively along a first direction and a second direction intersecting with the first direction. The bonding material is applied having a thermal expansion coefficient that is between the coefficients in the first direction and second direction of the crystal element.

7 Claims, 14 Drawing Sheets

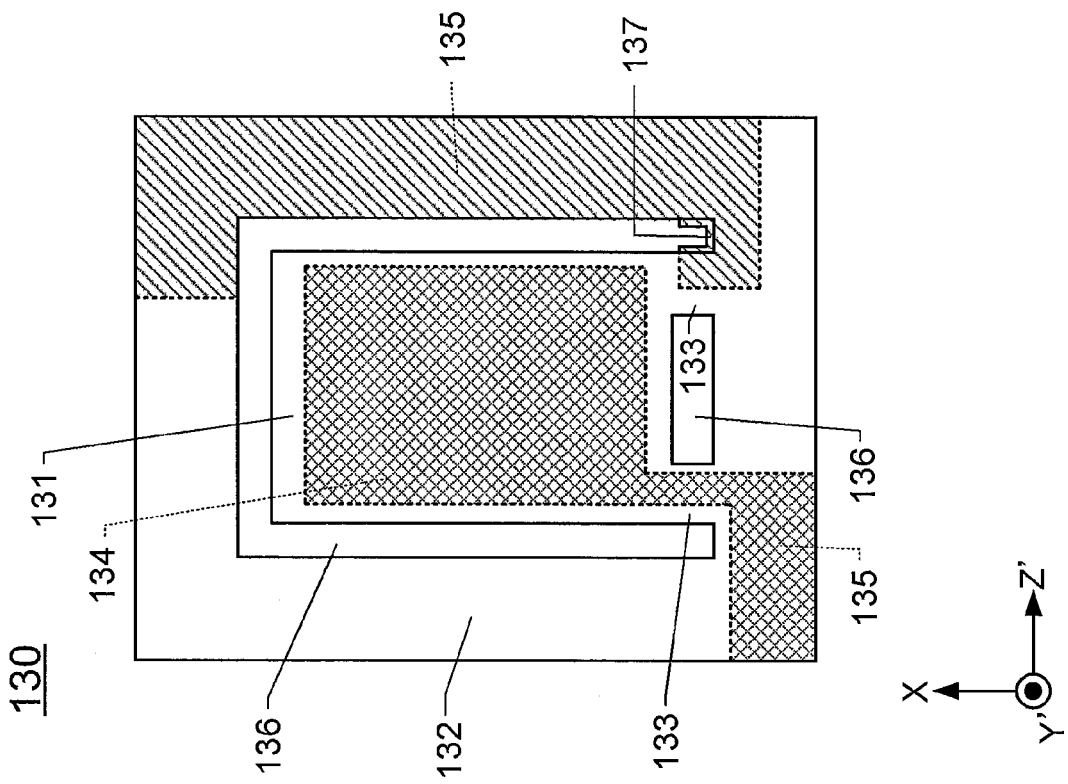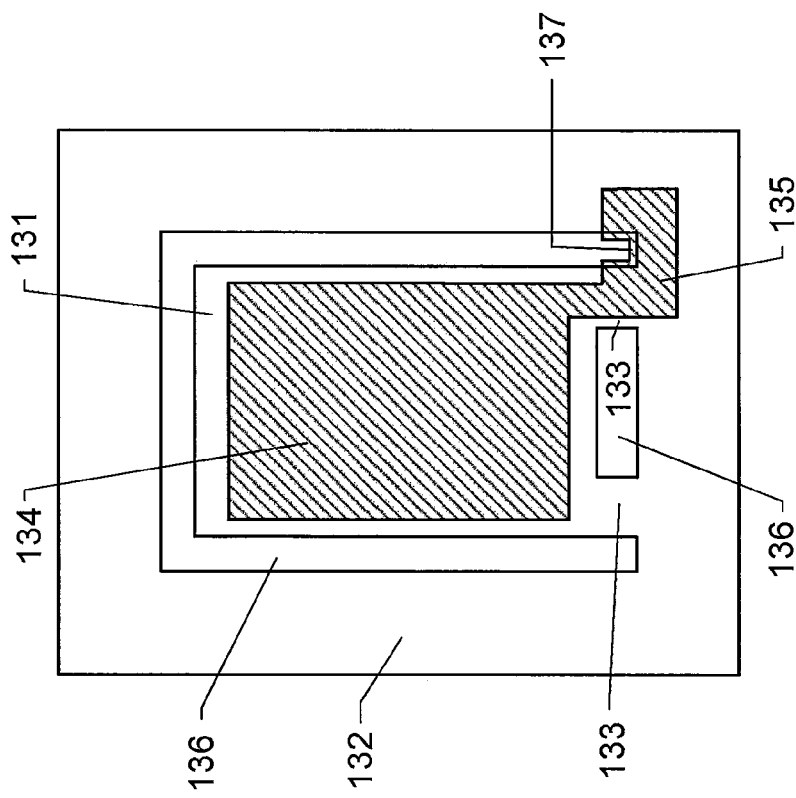

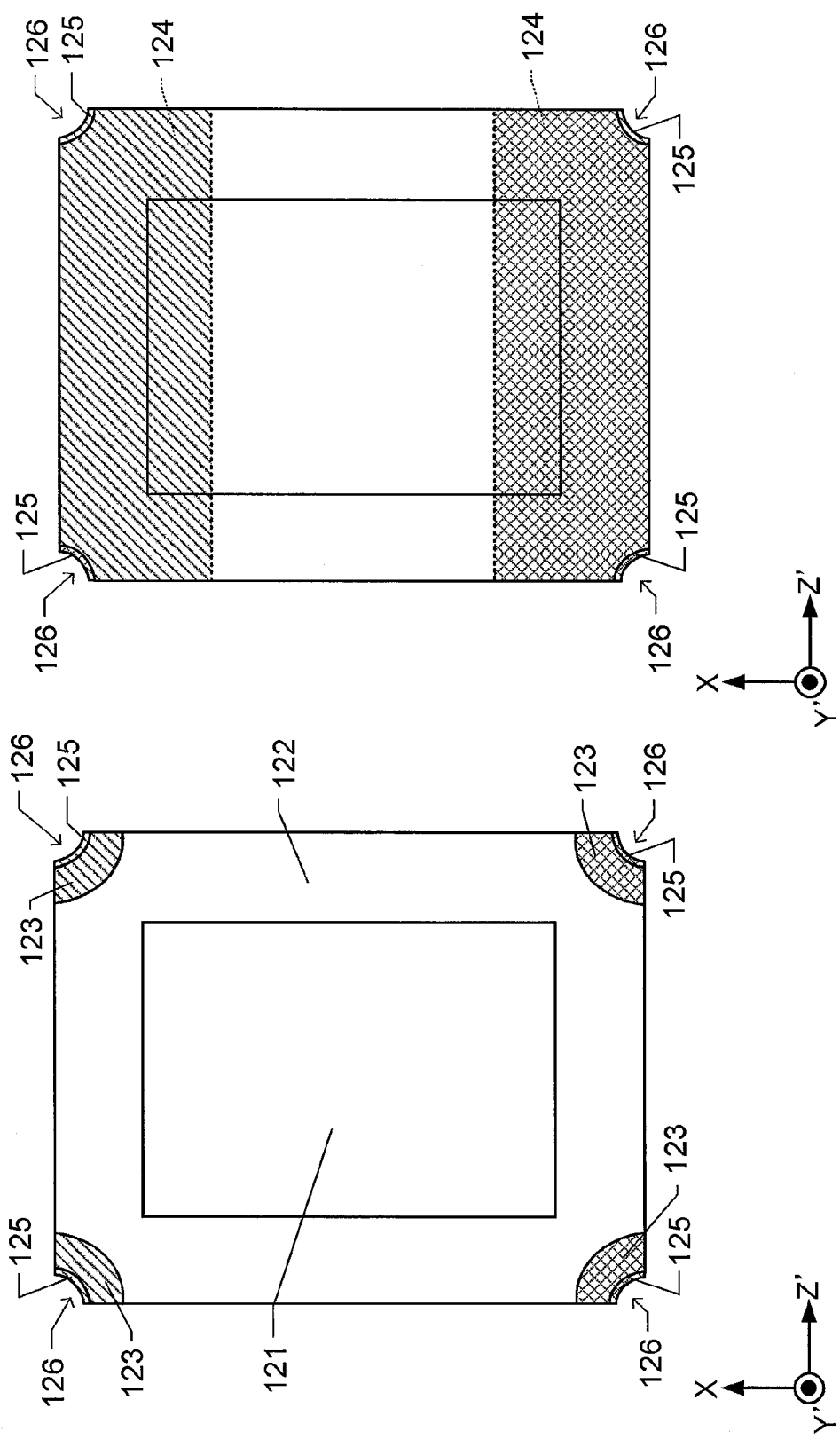

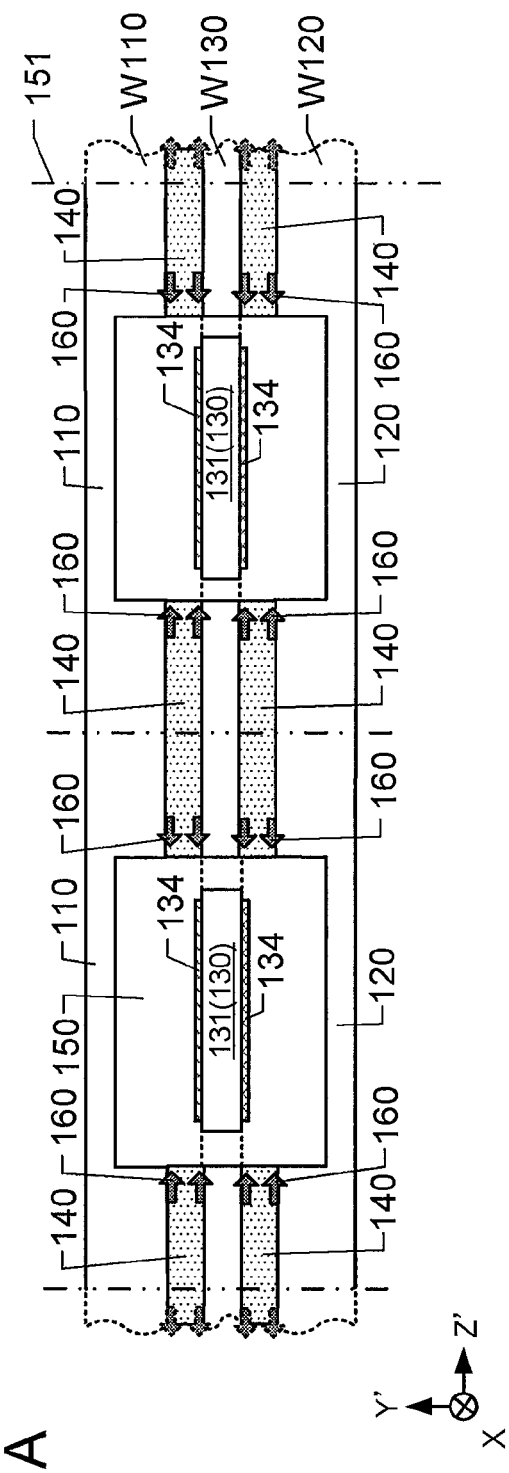
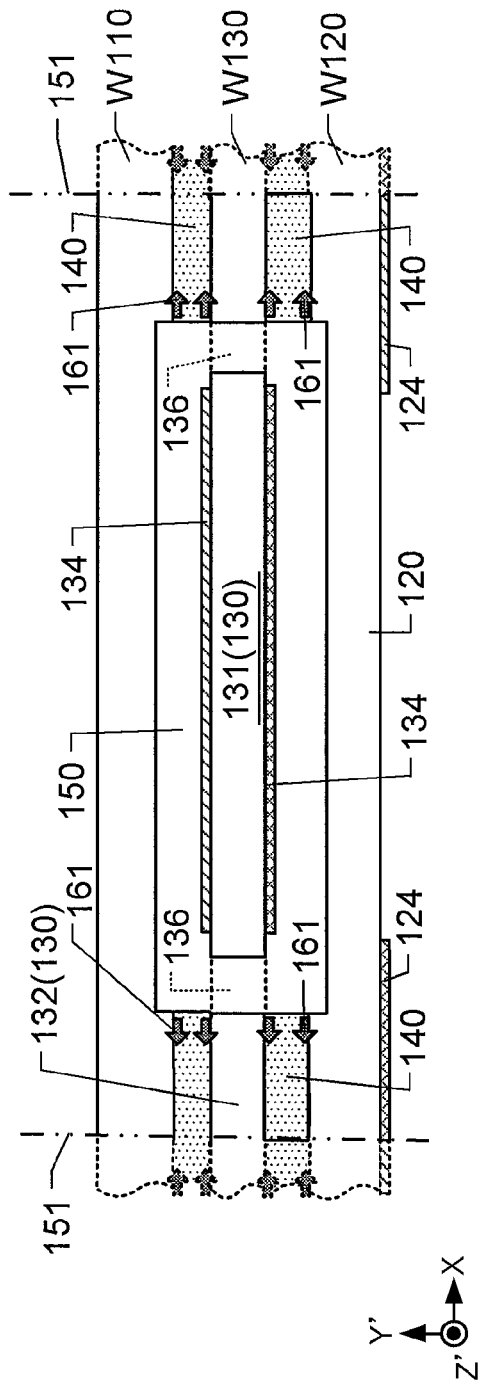

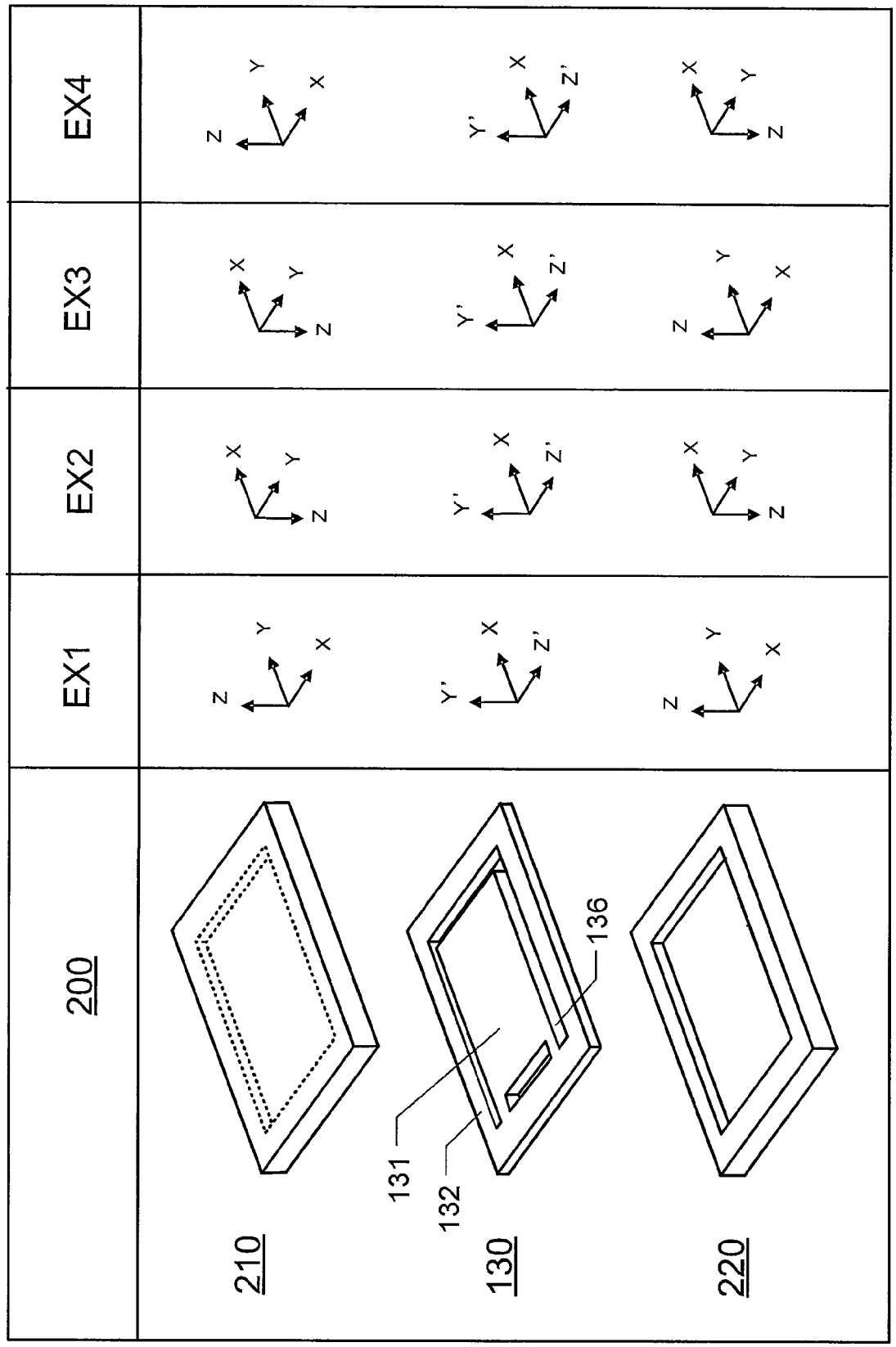

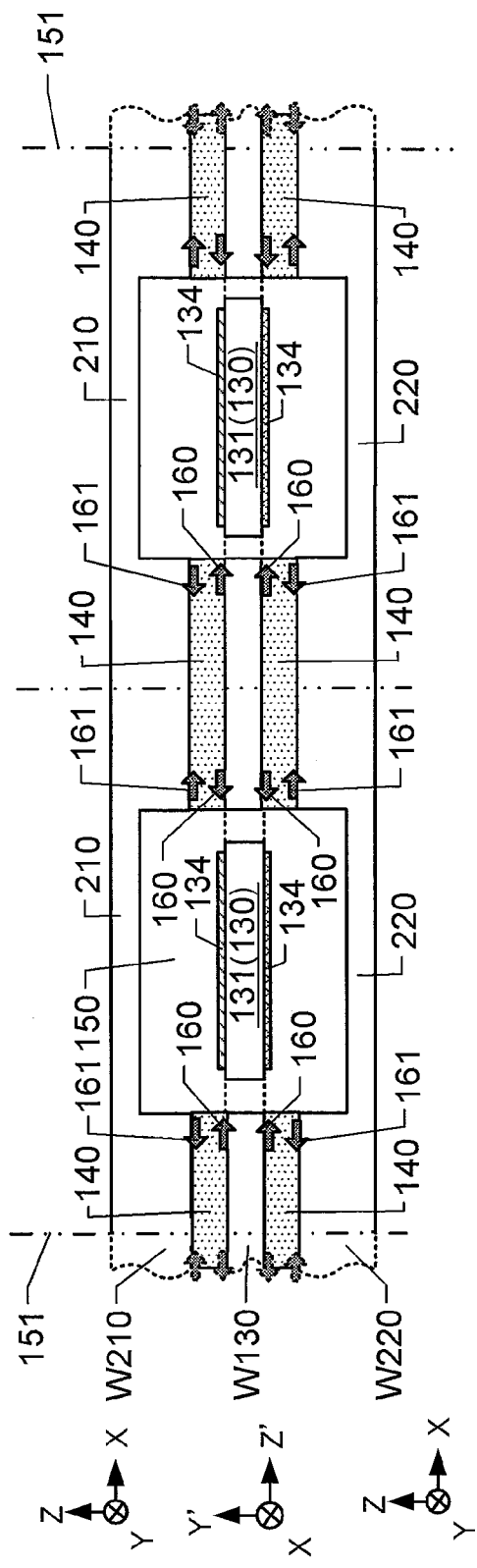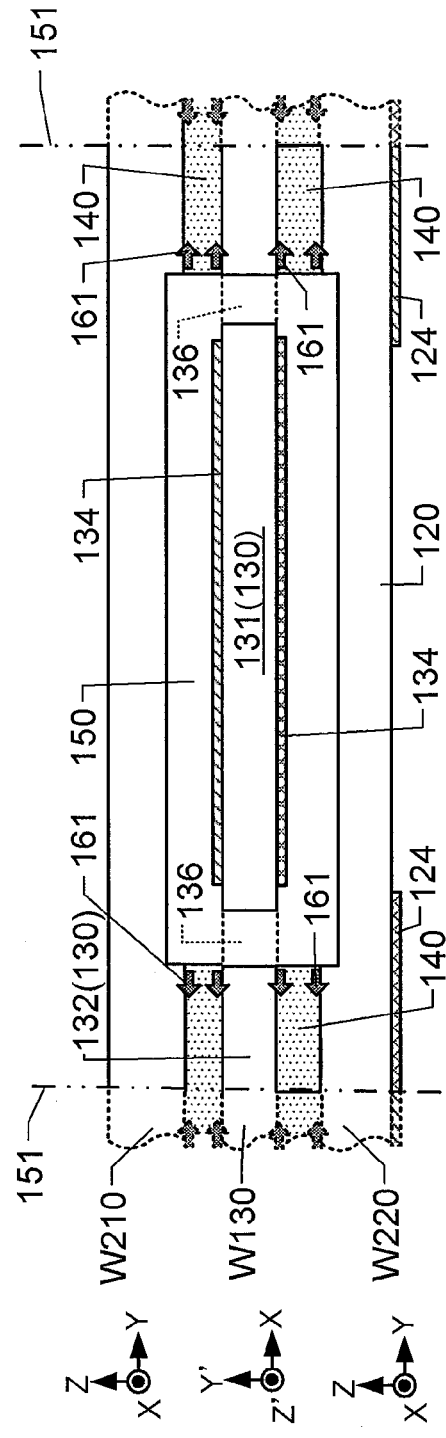

CRYSTAL DEVICE

CROSS-REFERENCE TO RELATED APPLICATION

This application claims the priority benefit of Japan patent application serial no. 2011-128023, filed on Jun. 8, 2011, and 2012-127725, filed on Jun. 5, 2012. The entirety of each of the above-mentioned patent applications is hereby incorporated by reference herein and made a part of specification.

FIELD OF THE INVENTION

The present invention pertains to a crystal device in which a base, a lid and a crystal element are bonded together using a bonding material.

DESCRIPTION OF THE RELATED ART

Conventional crystal device comprises a crystal element including an excitation part that vibrates at a predetermined frequency and a frame surrounding the excitation part, a base and a lid that are situated on each main surface of the crystal element. The crystal element, the base and the lid are bonded together using a bonding material. In such crystal device, stress is generated during the manufacturing process of the crystal device due to the difference in the thermal expansion coefficients among the bonding material and the crystal element, the base and the lid. Consequently, peeling of the bonding material from the crystal element, the base and the lid or damage to the crystal device due to the stress is resulted.

For example, Japan Unexamined Patent Publication No. 2008-259041 discloses a crystal vibrating device, in which the problems related to the peeling of bonding material due to the stress generated by the difference in the thermal expansion coefficient is prevented. The crystal vibrating device of Japan Unexamined Patent Publication No. 2008-259041 is fabricated by bonding a lid made of metals and a base made of ceramics using a bonding material, and the stress generated during the bonding of the lid and the base is prevented by adjusting the thermal expansion coefficient of the bonding material to be close or equal to the thermal expansion coefficients of the lid and the base.

RELATED ART

Patent Reference

[Patent Reference 1] Japan Unexamined Patent Publication No. 2008-259041

Problem to be Solved by the Invention

However, in the crystal device fabricated by placing the crystal element between the base and the lid and bonding packages using the bonding material, the thermal expansion coefficient of the bonding surface between the crystal element and the base and between the crystal element and the lid tends to vary depending on the directions of the bonding surface. In this case, the thermal expansion coefficient of the bonding material cannot be the approximate value or the same value of the thermal expansion coefficient of the crystal element, the base or the lid.

Therefore, the present invention provides a crystal device, in which the peeling of bonding material is prevented by using the bonding material having a thermal expansion coefficient between the thermal expansion coefficient of the first direction of the bonding surface of the crystal element and the thermal expansion coefficient of the second direction of the bonding surface of the crystal element.

SUMMARY OF THE INVENTION

A first aspect of the present invention is a crystal device. In its first aspect, a crystal device includes a crystal element, having a rectangular shape, formed by a crystal material and having an excitation part that vibrates when a voltage is applied and a frame which surrounds the periphery of the excitation part, the frame comprises edges respectively along a first direction and a second direction intersected with the first direction. The crystal device includes a base, having a rectangular shape, bonded to a principal surface of the frame and comprising edges respectively along the first direction and the second direction; and a lid, having a rectangular shape, bonded to another principal surface of the frame and comprising edges respectively along the first direction and the second direction. A bonding material is applied, the bonding material having a thermal expansion coefficient between the thermal expansion coefficient of the first direction of the crystal element and the thermal expansion coefficient of the second direction of the crystal element.

A second aspect of the present invention is a crystal device. In its second aspect, in the crystal device described in the first aspect, the crystal element is an AT-cut crystal material, and the base and the lid are the AT-cut crystal material, a Z-cut material or a glass material.

A third aspect of the present invention is a crystal device. In its third aspect, in the crystal device described in the first aspect, the crystal element is the Z-cut crystal material. And the base and the lid are the AT-cut crystal material, the Z-cut material or the glass material.

A fourth aspect of the present invention is a crystal device. In its fourth aspect, in the crystal device described in the first to third aspects, the bonding material is a polyimide resin or a glass material with a melting point of 500° C. or lower.

A fifth aspect of the present invention is a crystal device. In its fifth aspect, in the crystal device described in the fourth aspect, the thermal expansion coefficient of the bonding material is between 10.5-13 ppm/° C. (between ambient temperature to 200° C.).

Effects of the Invention

According to the present invention, a crystal device is provided, in which the peeling of bonding material is prevented by using the bonding material having thermal expansion coefficient between the thermal expansion coefficient of the first direction of the bonding surface of the crystal element and the second direction of the bonding surface of the crystal element.

BRIEF DESCRIPTION OF THE DRAWINGS

FIG. 3A is a plan view of the crystal element 130 and electrodes formed on its +Y'-axis surface.

FIG. 3B is a plan view of the crystal element 130 and electrodes formed on its surface at the −Y'-axis side.

FIG. 4A is a plan view of the base 120 and electrodes formed on its surface at the +Y'-axis side.

FIG. 4B is a plan view of the base 120 and electrodes formed on its surface at the −Y'-axis side.

FIG. 11A is a cross-sectional view of the bonded-together crystal wafer W130 and the lid wafer W110 in the Z'-axis direction.

FIG. 11B is a cross-sectional view of the bonded-together crystal wafer W130 and the lid wafer W110 in the X-axis direction.

FIG. 12 is a diagram showing combinations of crystal axes of the crystal element 130, the base 220 and the package 210.

FIG. 14A is a cross-sectional view of the bonded-together crystal wafer W130 and the lid wafer W210 in the Z'-axis direction.

FIG. 14B is a cross-sectional view of the bonded-together crystal wafer W130 and the lid wafer W210 in the X-axis direction.

DETAILED DESCRIPTION

Various representative embodiments are described below with reference to the respective drawings. It will be understood that the scope of the disclosure is not limited to the described embodiments, unless otherwise stated.

First Embodiment

<Configuration of the Crystal Device 100>

Figure 1:
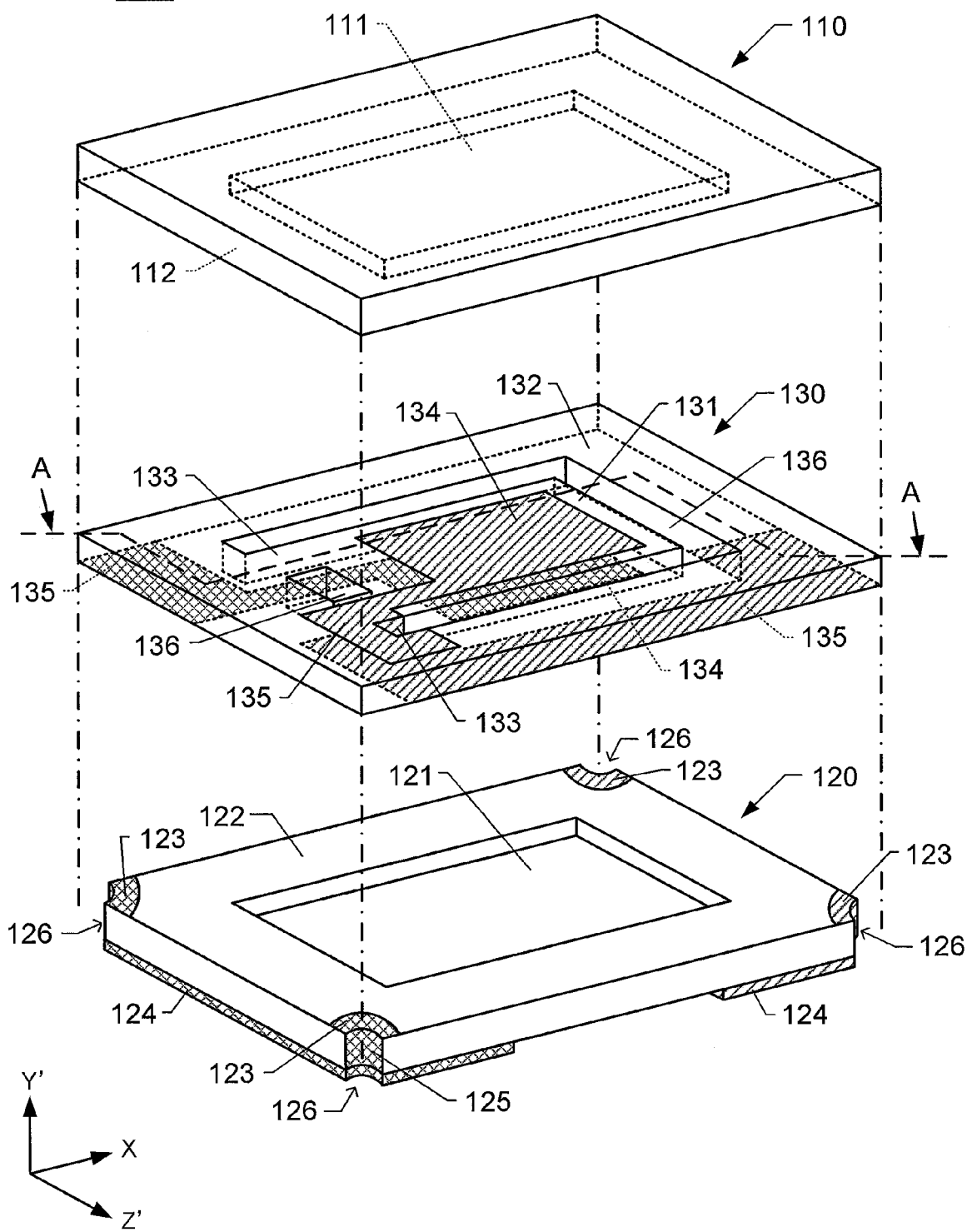
FIG. 1 is an exploded perspective view of a crystal device 100.

FIG. 1 is an exploded perspective view of a crystal device 100 according to the first embodiment. The crystal device 100 is a surface-mountable crystal device to be mounted on a printed substrate. The crystal device 100 comprises a lid 110, a base 120 and a crystal element 130. The lid 110, the base 120 and the crystal element 130 are fabricated from an AT-cut crystal material. An AT-cut crystal material has a principal surface (in the YZ plane), as opposed to a Y-axis of crystal axes (XYZ), is tilted by 35° 15' with respect to a Y-axis of crystal axes (XYZ), from a Z-axis to the Y-axis direction by taking an X-axis as a center. In the following description, new axes tilted with respect to the axial directions of the AT-cut crystal material are denoted as the Y'-axis and Z'-axis, respectively. Therefore, in the crystal device 100, the longitudinal direction of the crystal device 100 is the X-axis direction, the height direction of the crystal device 100 is the Y'-axis direction, and the direction perpendicular to the X-axis and Y'-axis directions is the Z'-axis direction. Also, in the crystal device 100, the crystallographic axes of the lid 110, the base 120 and the crystal element 130 are aligned in the X-axis, Y'-axis and Z'-axis directions.

The crystal element 130 comprises an excitation part 131 that vibrates at a predetermined vibration frequency, a frame 132 surrounding the excitation part 131 and a pair of joining portions 133 that connects the excitation part 131 and the frame 132. A through-slot 136 is situated between the excitation part 131 and the frame 132 and extends in the thickness direction (Y'-axis direction) of the crystal element 130. The pair of joining portions 133 connects an edge of the excitation part 131 at the −X-axis side and the frame 132 formed at the −X-axis side of the excitation part 131. A respective excitation electrode 134 is situated on each principal surfaces of the excitation part 131 at +Y'-axis side and at −Y'-axis side. Also, a pair of extraction electrodes 135 is formed on the frame 132, which is extracted from each excitation electrode 134. The extraction electrode 135 is extracted from the excitation electrode 134 formed on the surface at the −Y'-axis side, passes through the joining portion 133, and extends to a corner on the surface of the frame 132 at the −Z'-axis side, the −X-axis side and the −Y'-axis side. Also, the extraction electrode 135 is extracted from the excitation electrode 134 formed on the surface at the +Y'-axis side, passes through the joining portion 133 of the +Z'-axis side, passes through the edge surface of the through-slot 136 at the −X-axis side and the +Z'-axis side, and extends to a corner on the surface of the frame 132 at the +X-axis side, the +Z'-axis side and the −Y'-axis side.

A recess portion 111 and a bonding surface 112 surrounding the recess portion 112 are formed on the surface of the lid 110 at the −Y'-axis side. The bonding surface 112 is bonded to the surface of the frame 132 of the crystal element 130 at the +Y'-axis side using a bonding material 140 (see FIG. 2).

The surface of the base 120 includes a recess portion 121, a bonding surface 122 surrounding the recess portion 121 formed on a surface at the +Y'-axis side and conductive pads 123 formed on each corner of the surface at the +Y'-axis side. A bonding surface 122 is bonded to the surface of the frame 132 of the crystal element 130 at the −Y'-axis side using the bonding material 140 (see FIG. 2). A pair of mounting terminals 124 is formed on the surface of the base 120 at the −Y'-axis side. The castellations 126 are formed on four respective corners of the edge surface of the base 120. And the respective castellation electrodes 125 are situated on the castellations 126. The castellation electrode 125 electrically connects a conductive pad 123 and the mounting terminal 124. Also, the conductive pad 123 situated on the corner at the −X-axis side and −Z'-axis side is electrically connected to the extraction electrode 135 formed on the corner of the crystal element 130 at the −X-axis side and the −Z'-axis side. The conductive pad 123 situated on the corner at the +X-axis side and the +Z'-axis side is electrically connected to the extraction electrode 135 formed on the corner of the crystal element 130 at the +X-axis side and the +Z'-axis side.

Figure 2:
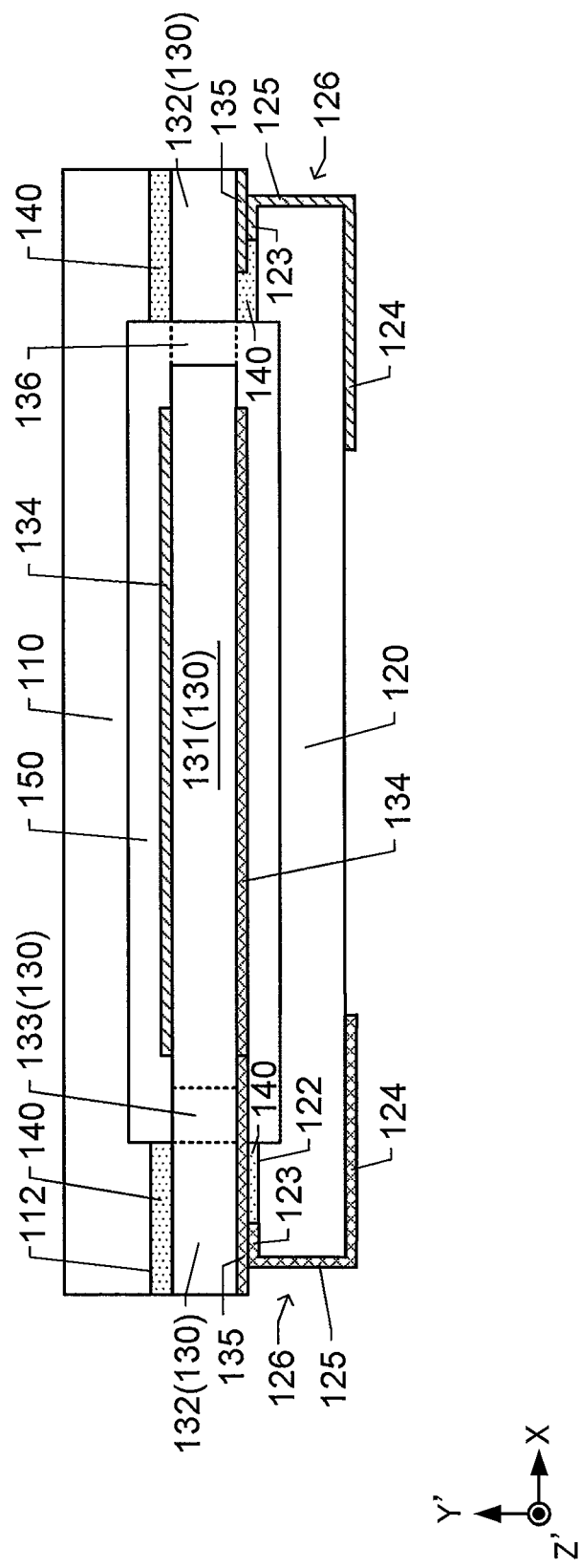
FIG. 2 is a cross-sectional view of FIG. 1 along A-A line.

FIG. 2 is a cross-sectional view of FIG. 1 along A-A line. On the crystal device 100, the lid 110 is situated on the surface of the crystal element 130 at the +Y'-axis side and the base 120 is situated on the surface of the crystal element 130 at the −Y'-axis side. After bonding the crystal device 100 together, the recess portion 111 of the lid 110 and the recess portion 121 of the base 120 define a cavity 150, and the excitation part 131 is situated inside the cavity 150. The cavity 150 is sealed by forming the bonding material 140 between the bonding surface 112 of the lid 110 and the surface of the frame 132 at the +Y'-axis side, and between the bonding surface 122 and the base 120 and the surface of the frame 132 at −Y'-axis side.

Also, the excitation electrode 134 and the mounting terminal 124 are electrically connected by electrically connecting the extraction electrode 135 situated on the frame 132 to the conductive pad 123 situated on the base 120.

FIG. 3A is a plan view of the crystal element 130 and electrodes formed on the surface at the +Y'-axis side. The crystal element 130 comprises an excitation part 131, a frame 132 surrounding the excitation part 131 and a pair of joining portions 133 that connects the excitation part 131 and the frame 132. The extraction electrode 135, extracted from the excitation electrode 134 situated on the surface of the excitation part 131 at the +Y'-axis side, passes through the joining portion 133 situated on the +Z'-axis side and connects to an edge-surface electrode 137 formed on the edge surface of the end of the through-slot 136 at the −X-axis side and the +Z'-axis side.

FIG. 3B is a plan view of the crystal element 130 and electrodes formed on its surface at the −Y'-axis side. FIG. 3B is a drawing of the crystal element 130 viewed from the +Y'-axis side and toward the −Y'-axis direction. The extraction electrode 135 is extracted from the excitation electrode 134 formed on the surface of the excitation part at the −Y'-axis side, passes through the joining portion 133 at the −Z'-axis side, and extends to the corner on the surface of the frame 132 at the −X-axis side, the −Z'-axis side and the −Y'-axis side. And the extraction electrode 135 is extracted from the edge-surface electrode 137 formed in the through-slot 136, passes through the frame 132 at the +Z'-axis side and extends to the corner on the surface of the frame 132 at the +X-axis side, the +Z'-axis side and the −Y'-axis side.

FIG. 4A is a plan view of the base 120 and electrodes formed on its surface at the +Y'-axis side. A recess portion 121 and a bonding surface 122 surrounding the recess portion 121 are formed on the surface of the base 120 at the +Y'-axis side. The castellations 126 are formed on edge surfaces of four respective corners of the base 120, and the castellation electrodes 125 are formed on each castellation 126. The conductive pads 123 are formed on four respective corners of the surface of the base 120 at the +Y'-axis side, and each conductive pad 123 is electrically connected to the castellation electrode 125.

FIG. 4B is a plan view of the base 120 and electrodes formed on its surface at the −Y'-axis side. A pair of mounting terminals 124 is formed on both +X-axis and −X-axis sides of the surface of the base 120 at the −Y'-axis side, and each mounting terminal is electrically connected to the castellation electrodes 125 formed on four respective corners of the base 120.

<Thermal Expansion Coefficient of the Crystal Material>

The X-axis and Y-axis, which are crystallographic axes, of the crystal material have same thermal expansion coefficient, and the Z-axis direction have smaller thermal expansion coefficient than the thermal expansion coefficient of the X-axis and Y-axis directions. Thus, the thermal expansion coefficient of each axial direction (X-axis, Y'-axis and Z'-axis directions) of the AT-cut crystal material differs, in which the AT-cut quartz material is derived by tilting 35° 15' from the Z-axis to the Y-axis direction about the Y-axis of a crystal-coordinate system (XYZ) and taking an X-axis as a center. The thermal expansion coefficient of the crystal material is explained using FIG. 5 as reference.

Figure 5:
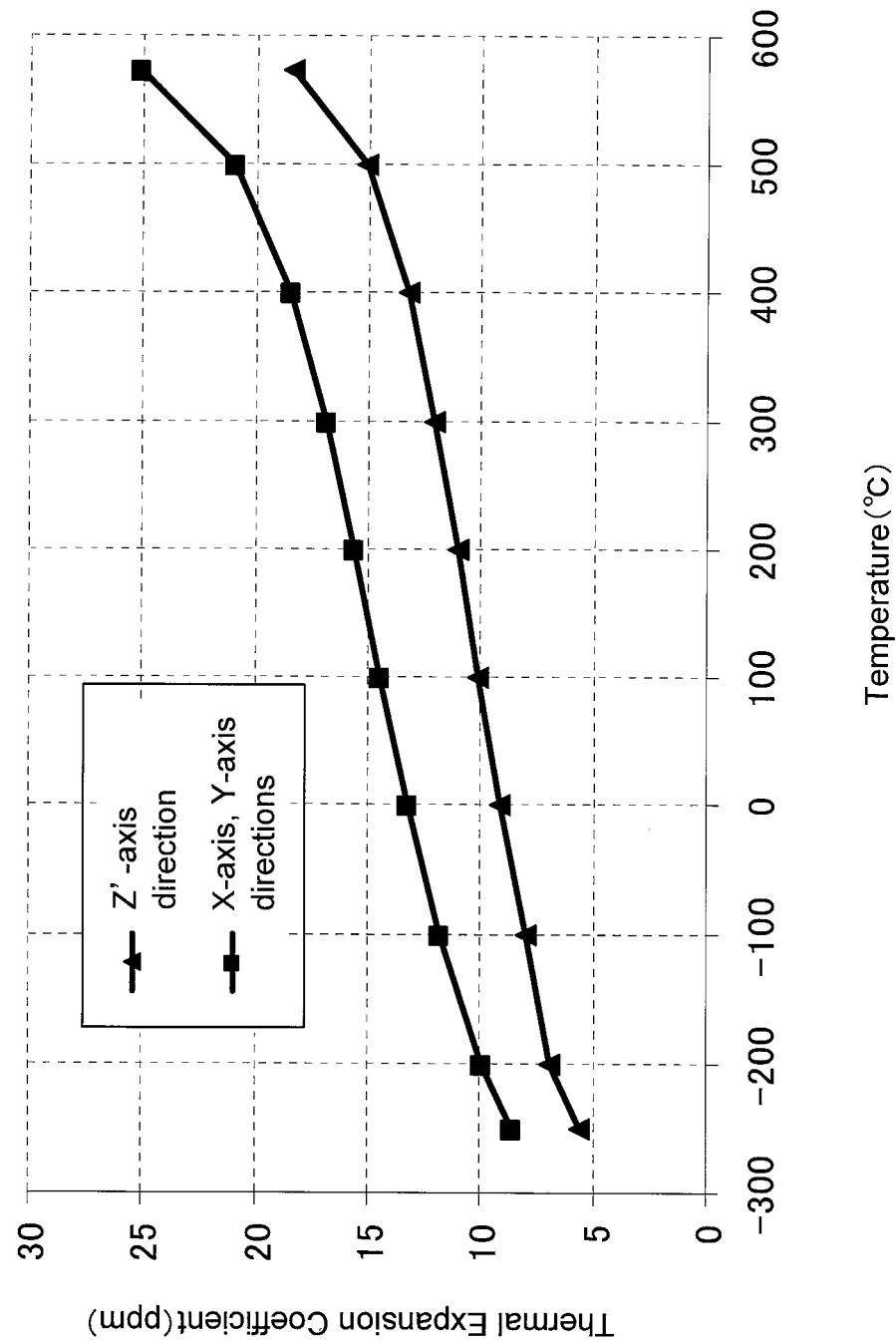
FIG. 5 is a graph showing a relationship between the thermal expansion coefficient in the X-axis direction, the Y-axis direction and the Z'-axis direction of the crystal material and the temperature.

FIG. 5 is a graph showing a relation between the thermal expansion coefficient in the X-axis direction, the Y-axis direction and the Z'-axis direction of the crystal material and the temperature. The ordinate of the graph indicates the thermal expansion coefficient (ppm) and the abscissa of the graph indicates temperatures (° C.). The thermal expansion coefficient indicates a rate of expansion of the length of an object due to a rise of temperature per 1° C. Rectangular dots filled with black in the graph indicate the thermal expansion coefficient in the X-axis direction and the Y-axis direction of the crystal material. Triangular dots filled with black indicate the thermal expansion coefficient in the Z'-axis direction of the crystal material. The thermal expansion coefficient in the Z'-axis direction is larger than the thermal expansion coefficient in the Z-axis direction and smaller than the X-axis direction, and the thermal expansion coefficient can be derived from such values. The thermal expansion coefficient in the Z'-axis direction is 5.6 ppm at −250° C. and as the temperature rises, it also rises and reaches 18.38 ppm at 573° C. The thermal expansion coefficient in the X-axis and Y-axis directions is 8.6 ppm at −250° C. and as the temperature rises, it also rises and reaches 25.15 ppm at 573° C.

The crystal element 130, the lid 110 and the base 120 of the crystal device 100 are fabricated from the AT-cut crystal material, and as shown in FIG. 1, the crystallographic axes of the lid 110, the base 120 and the crystal element 130 are aligned in the same direction. Since the lid 110, the base 120 and the crystal element 130 are bonded on a plain surface includes the X-axis and the Z'-axis, the thermal expansion coefficient of the X-axis and Z'-axis directions of the crystal material is considered when considering the peeling of the bonding material 140. Between 30° C. to 200° C., the thermal expansion coefficient in the Z'-axis direction is approximately 10 ppm. Also, according to FIG. 5, between 30° C. to 200° C., the thermal expansion coefficient between in the X-axis direction is approximately 15 ppm. For the reason which will be explained during the manufacturing step of the crystal device 100, the bonding material 140 used in the crystal device 100 has the thermal expansion coefficient which falls between the thermal expansion coefficient in the short-edge direction (Z'-axis direction) of the crystal device 130 and the long-edge direction (X-axis direction) of the crystal device 130. Thus, the bonding material 140 has the thermal expansion coefficient between 10-15 ppm, which is higher than the thermal expansion coefficient of crystal material in the Z'-axis direction and smaller than the thermal expansion coefficient of crystal material in the X-axis direction. Further, the thermal expansion coefficient of the bonding material 140 preferably falls between 10.5-13 ppm. For the bonding material 140, a low-melting-point glass having the melting point of 500° C. or lower can be used.

<Manufacturing Method of the Crystal Device 100>

Figure 6:
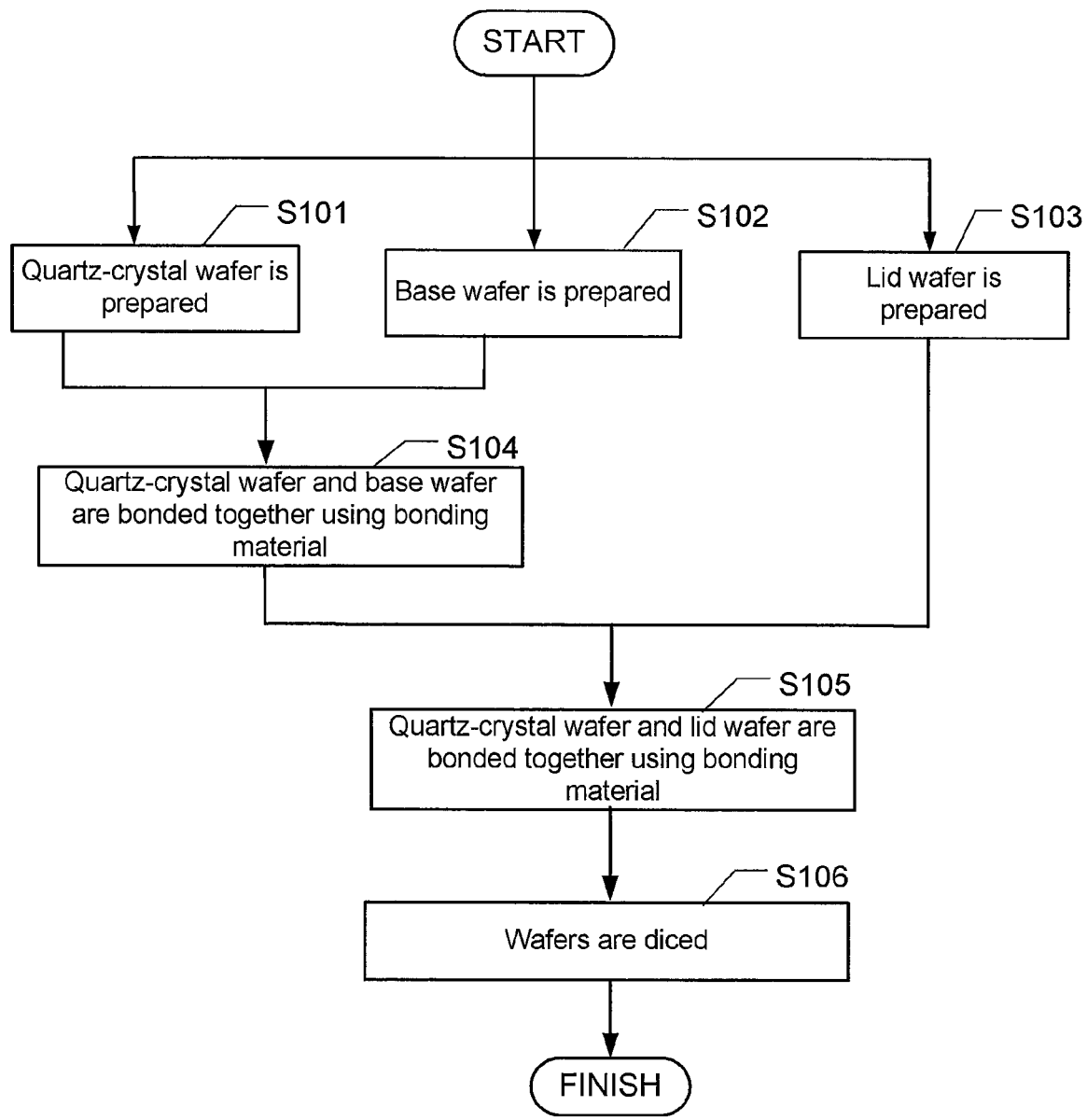
FIG. 6 is a flow-chart showing a manufacturing method of the crystal device 100.

FIG. 6 is a flow-chart showing a manufacturing step of the crystal device 100. The manufacturing method of the crystal device 100 is explained using FIG. 6 as reference.

In step S101, a crystal wafer W130 is prepared. A plurality of crystal elements 130 is fabricated on the crystal wafer W130. The crystal wafer W130 is explained using FIG. 7 as a reference.

Figure 7:
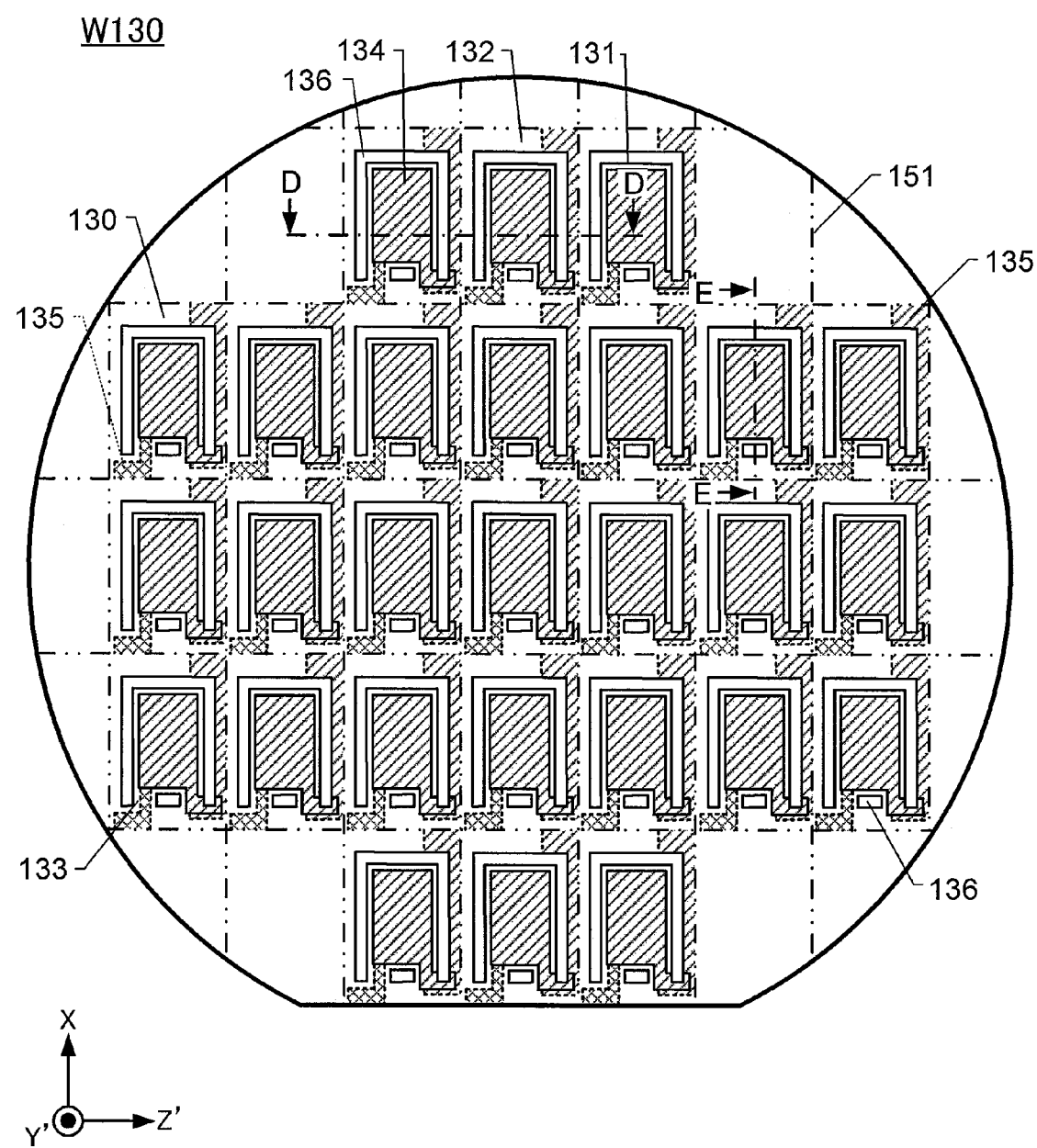
FIG. 7 is a plan view of the crystal wafer W130.

FIG. 7 is a plan view of the crystal wafer W130. The crystal wafer W130 is fabricated from an AT-cut crystal material. Multiple crystal elements 130 are formed on the crystal wafer W130. In FIG. 7, each crystal element 130 is surrounded by scribe line 151, indicated using dash-dot lines, used as a reference for separating the wafer in step S106 of FIG. 6, which will be explained hereafter. By forming the through-slot 136 on each crystal element 130, the excitation part 131, the frame 132 and the joining portions 133 are formed. The excitation electrodes 134 are formed on each surfaces of the excitation part 131 at the +Y'-axis side and the −Y'-axis side, and the respective extraction electrodes 135, extracted from the excitation electrodes 134, are formed on each frame 132.

In step S102, a base wafer W120 is prepared. Multiple bases 120 are formed on the base wafer W120. Hereinafter, the base wafer W120 is explained using FIGS. 8A and 8B as references.

Figure 8A:
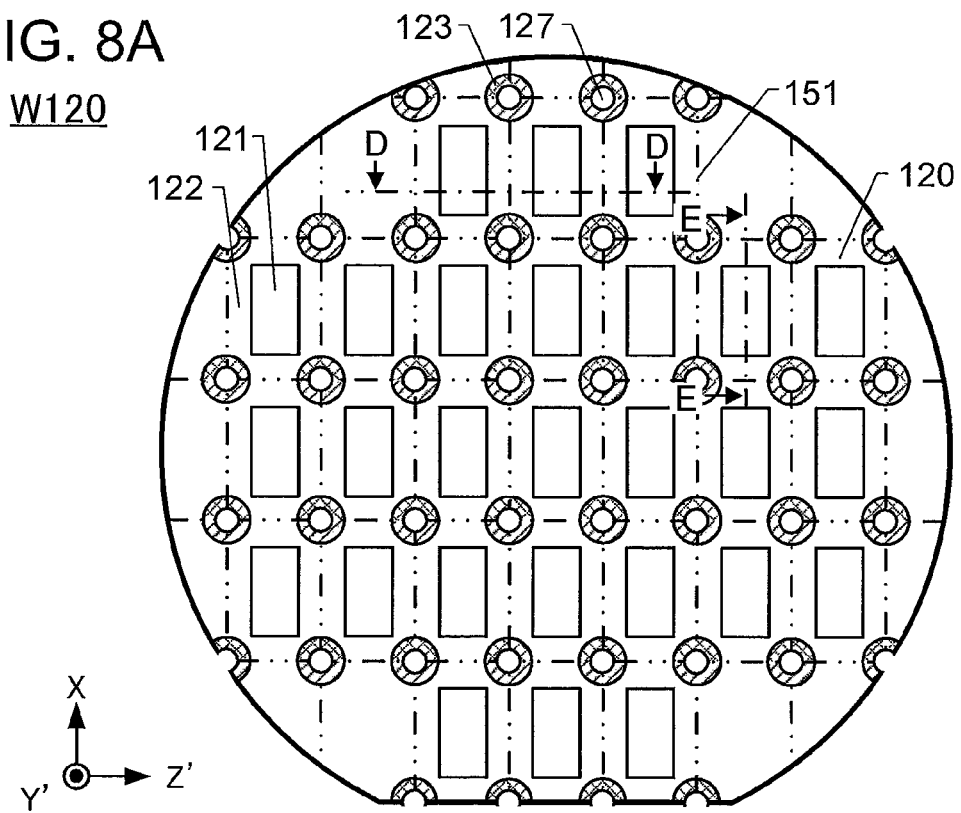
FIG. 8A is a plan view of the base wafer W120 with electrodes formed on its surface at the +Y'-axis side.

FIG. 8A is a plan view of the base wafer W120 with electrodes formed on its surface at the +Y'-axis side. The crystal wafer W120 is fabricated from an AT-cut crystal material, and a plurality of bases 120 is formed thereon. In FIG. 8, scribe lines 151 are illustrated on the base wafer W120, and each base 120 is surrounded by the scribe line 151. A recess portion 121 is formed on the surface of the base 120 at the +Y'-axis side, and a bonding surface 122 is situated so as to surround the recess portion 121. On each intersection point of the scribe line 151, a through-hole 127 is formed that cuts through the base wafer W120. The through-hole 127 forms the castellations 126 of each base 120 (see FIG. 4A). Surrounding each through-hole 127 on the surface of the base wafer W120 at the +Y'-axis side, a conductive pad 123 is formed, and the castellation electrode 125 (see FIG. 1) is formed on the edge surface of the through-hole 127.

Figure 8B:
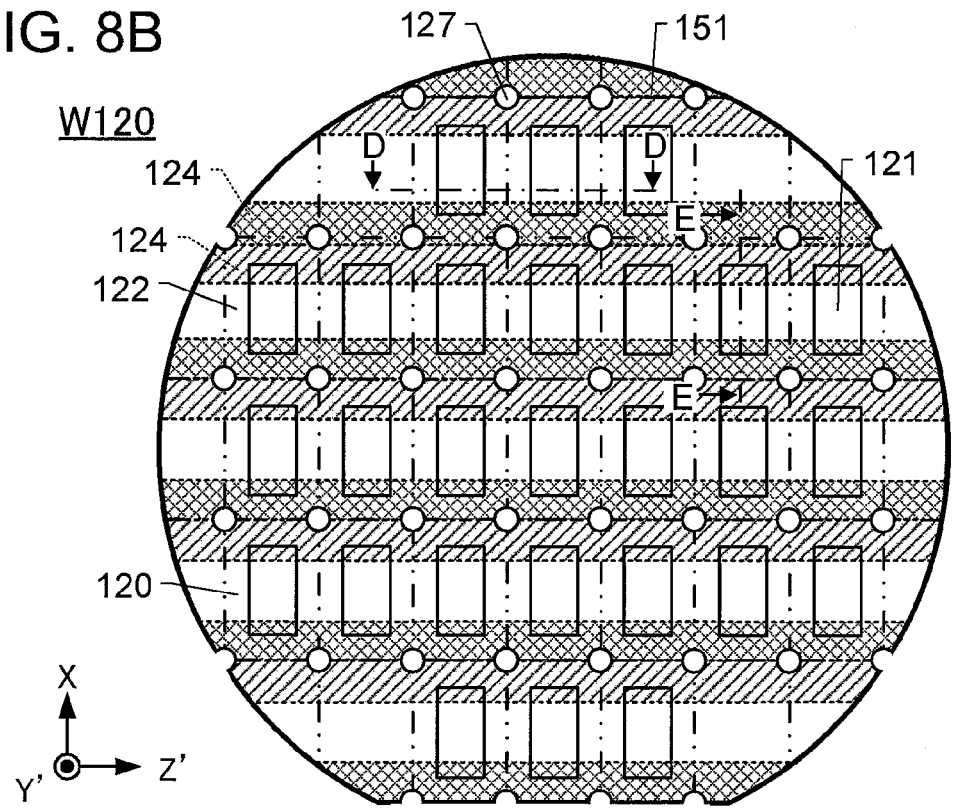
FIG. 8B is a plan view of the base wafer W120 with electrodes formed on its surface at the −Y'-axis side.

FIG. 8B is a plan view of the base wafer W120 with electrodes formed on its surface at the −Y'-axis side. FIG. 8B shows the base wafer W120 as viewed from the +Y'-axis side, and the mounting terminals 124 are formed on its surface at the −Y'-axis side. On the base wafer W120, the mounting terminals 124 are formed across the Z'-axis direction of the base 120, and are connected to the castellation electrodes 125 (see FIG. 1) formed on the edge surface of the through-hole 127.

In step S103, the lid wafer W110 is prepared. A plurality of lids 110 is formed on the lid wafer W110. The lid wafer W110 is explained using FIG. 9 as reference.

Figure 9:
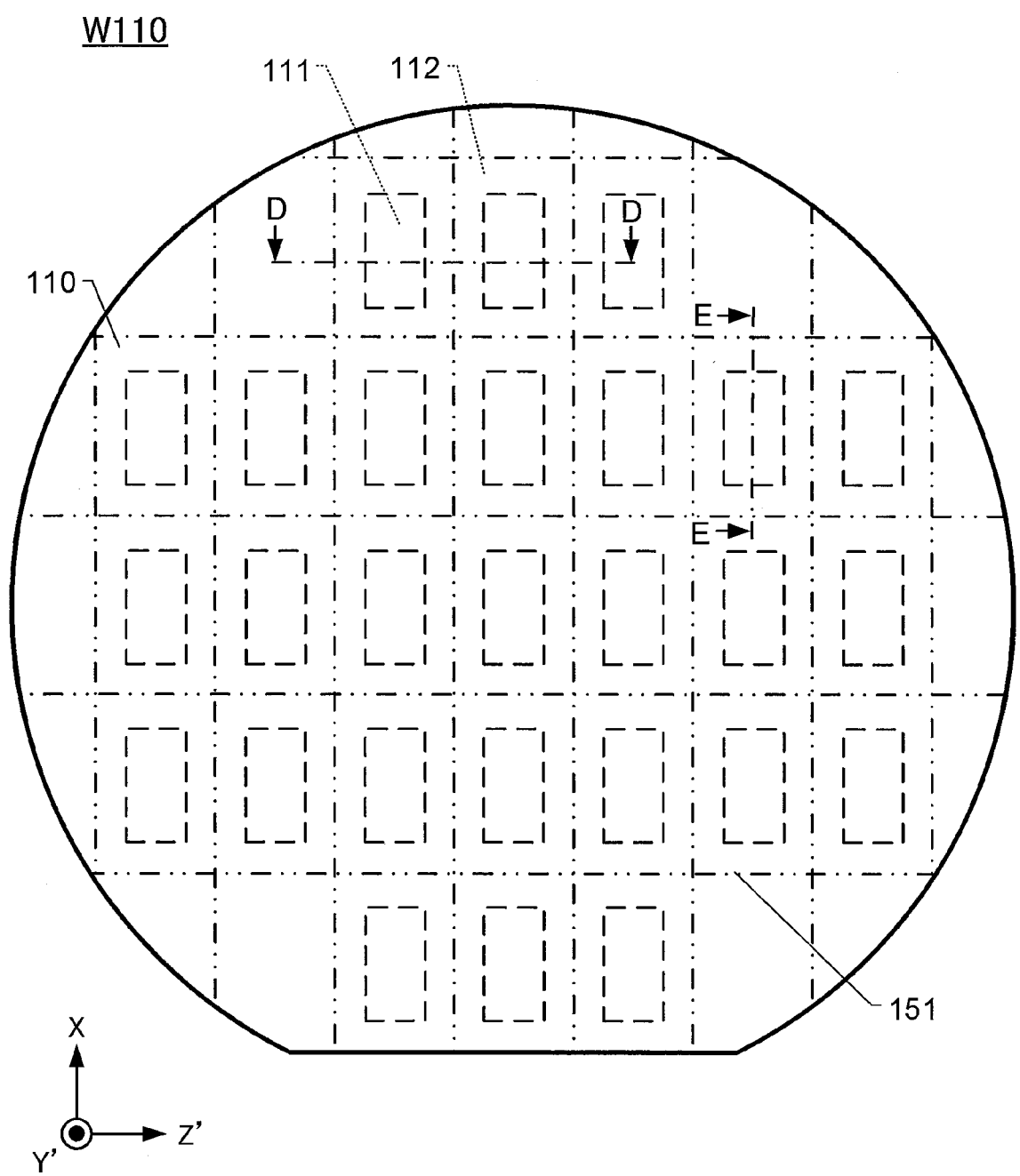
FIG. 9 is a plan view of the lid wafer W110.

FIG. 9 is a plan view of the lid wafer W110. The lid wafer W110 is fabricated from an AT-cut crystal material, and a plurality of lids 110 is formed thereon. In FIG. 9, scribe lines 151 are illustrated on the lid wafer W110, and each lid 110 is surrounded by the scribe lines 151. A recess portion 111 is formed on the surface of the lid 110 at the −Y'-axis side, and a bonding surface 112 is situated so as to surround the recess portion 111.

In step S104, the crystal wafer W130 and the base wafer W120 are bonded together. The bonding process of the crystal wafer W130 and the base wafer W120 is explained using FIGS. 10A, 10B and 10C as references.

Figure 10A:
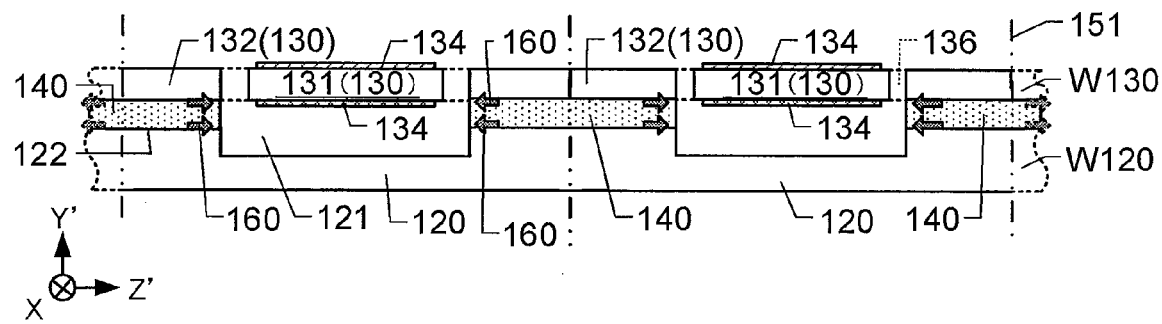
FIG. 10A is a cross-sectional view of the bonded-together crystal wafer W130 and the base wafer W120 as viewed from the Z'-axis direction.

FIG. 10A is a cross-sectional view of the bonded-together crystal wafer W130 and base wafer W120 as viewed from the Z'-axis direction of the wafer. Also, FIG. 10A is a cross-sectional view of FIGS. 7, 8A, 8B and 10C along the line D-D. The crystal wafer W130 and the base wafer W120 are aligned so that the surface of the frame 132 at the −Y'-axis side overlaps with the bonding surface 122, and are bonded together using the bonding material 140.

In the bonding process, when the low-melting-point glass having the melting point of 380° C. or lower is used as the bonding material 140, the bonding material 140 is applied onto the surface of the frame 132 of the crystal wafer W130 at the −Y'-axis side or the bonding surface 122 of the base wafer W120. The crystal wafer W130 and the base wafer W120 are aligned so that the bonding surface 122 overlaps with the surface of the frame 132 at the −Y'-axis side, and the wafers are bonded by the wafer and the bonding material 140 at a temperature of 380° C. or above which the bonding material 140 is at melted status. After bonding together, the wafers are cooled down to a room temperature.

When the wafers are cooled down to a room temperature or ambient temperature, stress is generated due to the difference of the thermal expansion coefficient between each wafer and the bonding material 140. Since the thermal expansion coefficient of the bonding material 140 applied on the crystal device 100 is larger than the thermal expansion coefficient of the crystal material in the Z'-axis direction, the bonding material 140 tends to shrink more in comparison to the crystal material in the Z'-axis direction. Thus, the bonding surface between the crystal element 130 and the bonding material 140 and the bonding surface between the base 120 and the bonding material 140 are subjected to a tensile stress 160 formed by the crystal element 130 and the base 120 pulling the bonding material 140 in the Z'-axis direction. The bonding material 140 is pulled toward the Z'-axis directions due to the tensile stress 160.

Figure 10B:
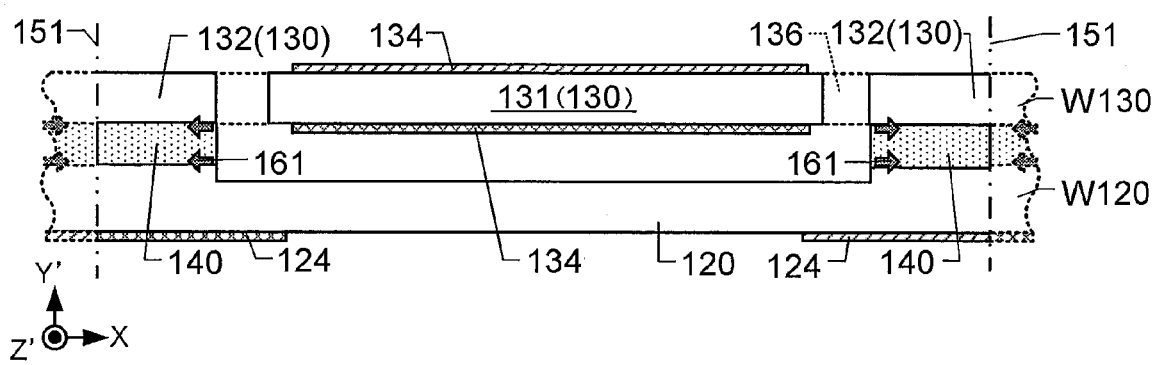
FIG. 10B is a cross-sectional view of the bonded-together crystal wafer W130 and the base wafer W120 as viewed from the X-axis direction.

FIG. 10B is a cross-sectional view of the bonded-together crystal wafer W130 and the base wafer W120 as viewed from the X-axis direction. Also, FIG. 10B is a cross-sectional view of FIGS. 7, 8A, 8B and 10C along the line E-E. When the crystal wafer W130 and the base wafer W120 are cooled down to a room temperature, stress is generated due to the difference of the thermal expansion coefficient between each wafer and the bonding material 140. Since the thermal expansion coefficient of the bonding material 140 applied on the crystal device 100 is smaller than the thermal expansion coefficient of the crystal material in the X-axis direction, the bonding material 140 tends to shrink less in comparison to the crystal material in the X-axis direction. Thus, the bonding surface between the crystal element 130 and the bonding material 140 and the bonding surface between the base 120 and the bonding material 140 are subjected to a compressional stress 161 formed by the crystal element 130 and the base 120 compressing the bonding material 140 in the X-axis direction. The compressional stress 161 compresses the bonding material 140 toward the X-axis direction.

Figure 10C:
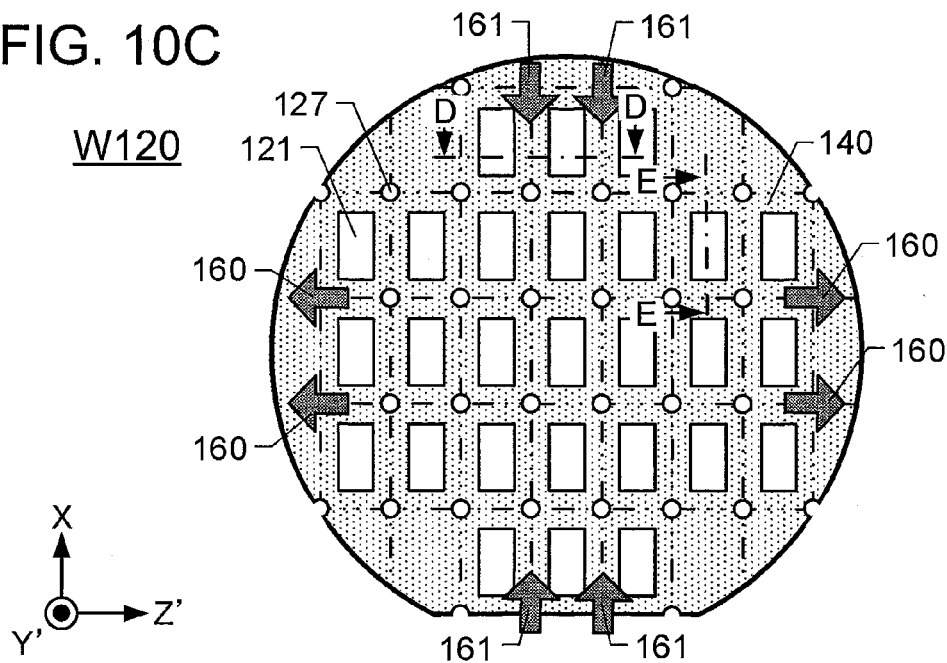
FIG. 10C is a plan view of the base wafer W120.

FIG. 10C is a plan view of the base wafer W120. In FIG. 10C, the bonding material 140 is illustrated as hatched, which is applied on the portions other than the recess portions 121 on the surface of the base wafer W120 at the +Y'-axis side and the through-holes 127. The bonding surface between the bonding material 140 and the base wafer W120 is subjected to the tensile stress 160 in the Z'-axis direction and subjected to the compressional stress 161 in the X-axis direction.

Going back to FIG. 6, in step S105, the crystal wafer W130 and the lid wafer W110 are bonded together using the bonding material 140. The bonding of the crystal wafer W130 and the lid wafer W110 is explained using FIGS. 11A and 11B as references.

FIG. 11A is a cross-sectional view of the bonded-together crystal wafer W130 and the lid wafer W110 in the Z'-axis direction. Also, FIG. 11A is a cross-sectional view of FIGS. 7, 8A, 8B and 9 along the line D-D. The crystal wafer W130 and the lid wafer W110 are bonded together using the bonding material 140. The boding step in step S105 is the same as the bonding step in step S104 for bonding the crystal wafer W130 and the base wafer W120 together. As explained in step S104, after each wafer is bonded together using the bonding material 140, the wafers and the bonding material 140 are cooled down to a room temperature. Since the thermal expansion coefficient of the bonding material 140 is larger than the thermal expansion coefficient of the crystal material in the Z'-axis direction, the bonding material 140 tends to shrink more in comparison to the crystal material in the Z'-axis direction. Thus, the bonding surface between the crystal element 130 and the bonding material 140 and the bonding surface between the lid 110 and the bonding material 140 are subjected to the tensile stress 160 formed by the crystal element 130 and the lid 110 pulling the bonding material 140 in the Z'-axis direction. The tensile stress 160 pulls the bonding material 140 toward the Z'-axis directions.

FIG. 11B is a cross-sectional view of the bonded-together crystal wafer W130 and the lid wafer W110 in the X-axis direction. Also, FIG. 11B is a cross-sectional view of FIGS. 7, 8A, 8B and 9 along the line E-E. As explained in FIG. 10B, the thermal expansion coefficient of the bonding material 140 applied onto the crystal device 100 is smaller than the thermal expansion coefficient of the crystal material in the X-axis direction, and the bonding material 140 tends to shrink less in comparison to the crystal material in the X-axis direction. Thus, the bonding surface between the crystal element 130 and the bonding material 140 and the bonding surface between the lid 110 and the bonding material 140 are subjected to a compressional stress 161 formed by the crystal element 130 and the lid 110 compressing the bonding material 140 in the X-axis direction. The compressional stress 161 compresses the bonding material 140 toward the X-axis directions.

Going back to FIG. 6, in step S106, the wafers are cut by dicing. Individual crystal devices 100 are manufactured by separating the wafers along the scribe line 151.

On the crystal device 100, the bonding material 140, which has the coefficient between the thermal expansion coefficient in the X-axis direction of the crystal element 130 and the Z'-axis direction of the crystal element 130, was used. Therefore, the bonding surfaces between the bonding material 140 and each wafers are subjected to the compressional stress 161 and the tensile stress 160 in the X-axis direction and in the Z'-axis direction respectively. Since the stress applied on the bonding material 140 of the crystal device 100 is separated into the compressional stress 161 and the tensile stress 160, the amount of a stress is reduced and the generation of a large stress in a particular direction is prevented. Also, although glass tends to be fragile against the tensile stress, it also tends to be strong against the compressional stress. The stress generated onto the bonding material 140 is calculated by multiplying the stress per length times the length of the bonding material 140. Since it is assumed that a stronger stress is generated toward the X-axis direction, which is parallel to the long-edge of the crystal device 100, than that in the Z'-axis direction, which is the short-edge, it is preferred that the stronger compressional stress is applied in the X-axis direction of the crystal device 100, which is a direction parallel to longitudinal direction, than the tensile stress. In the crystal device 100, because the thermal expansion coefficient of the bonding material 140 being smaller than the thermal expansion coefficient of the crystal material in the X-axis direction, the compressional stress is generated toward the X-axis direction of the bonding material 140. Considering the above, the value of the thermal expansion coefficient of the bonding material 140 is preferably less than 15 ppm, which is a thermal expansion coefficient of the crystal material in the X-axis direction, and more than 10 ppm, which is a thermal expansion coefficient of the crystal material in the Z'-axis direction. Further, since the tensile stress is applied in the Z'-axis direction, the thermal expansion coefficient of the bonding material 140 preferably has a value closer to the thermal expansion coefficient in the Z'-axis direction, that the tensile stress can be reduced. Furthermore, since the bonding strength of the crystal material is strengthened whenever the compressional stress is applied on the low-melting-point glass, the thermal expansion coefficient of the low-melting-point glass is preferably smaller than the thermal expansion coefficient of the crystal material. However, if a low-melting-point glass having the thermal expansion coefficient of smaller than between 10-10.5 ppm was used, which is far off from the thermal expansion coefficient in the X-axis direction of 15 ppm, the difference between the thermal expansion coefficient of the crystal material in the X-axis direction and thermal expansion coefficient of the low-melting-point glass becomes larger, which causes warp on the wafer and the manufacturing process to become difficult. Therefore, the value of the thermal expansion coefficient of the bonding material 140 is preferably closer to the thermal expansion coefficient in the Z'-axis direction, a direction in which the compressional stress is applied, than the X-axis direction, and is preferably between 10.5-13 ppm and excluding the value between 10-10.5 ppm.

Also, on the crystal device 100, since the crystallographic axes of the crystal element 130, the base 120 and the lid 110 are aligned in the same direction, the stress among the crystal element 130, the base 120 and the lid 110 are reduced. This prevents warps on wafers due to the thermal expansion coefficient during the manufacturing process of the crystal device 100. Furthermore, since the same base materials are used for the base 120 and the lid 110, the same bonding materials having the same thermal expansion coefficient are preferably used as the bonding material 140 for bonding the crystal element 130 and the base 120, and for bonding the crystal element 130 and the lid 110.

Second Embodiment

A Z-cut crystal material or a glass material can be used for the base or the lid. An advantage of the Z-cut crystal material or the glass material is that these materials are cheaper than the AT-cut crystal material. Hereinbelow, the crystal device having the Z-cut crystal material or the glass material as the base or lid is explained. In the explanation below, same numberings are used for components explained in the first embodiment, explanations are omitted for same components explained in the first embodiment, and the crystallographic axes of the crystal element are used to explain the crystallographic axes of the crystal device.

FIG. 12 is a diagram showing combinations of crystallographic axes of the crystal element 130, the base 220 and the package 210. The crystal device 200 comprises a lid 210 and a base 220, which uses a Z-cut crystal material as a base material, and a crystal element 130, which uses an AT-cut crystal material as a base material. Other than the use of the Z-cut crystal material as a base material, configurations of the lid 210 and the base 220 are the same as the configurations of the lid 110 and the base 120. Since the Z-cut crystal material is cut along the Z-axis direction as the normal direction of a wafer, the crystal device 200 is constituted by bonding the X-Z' surface of the crystal element 130 and the X-Y surface of the base 220 and the lid 210.

The first example EX1 shown in FIG. 12 is an example of combination in which the X-axis direction, the Y'-axis direction and the Z'-axis direction of the crystal element 130 are parallel to the Y-axis direction, the Z-axis direction and the X-axis direction of the lid 210 and the base 220.

The second example EX2 is an example of combination in which the X-axis direction, the Y'-axis direction and the Z'-axis direction of the crystal element 130 are parallel to the X-axis direction, the Z-axis direction and the Y-axis direction of the lid 210 and the base 220.

The third example EX3 is an example of combination in which the X-axis direction, the Y'-axis direction and the Z'-axis direction of the crystal element 130 are parallel to the X-axis direction, the Z-axis direction and the Y-axis direction of the lid 210, while the X-axis direction, the Y'-axis direction and the Z'-axis direction of the crystal element 130 are parallel to the Y-axis direction, the Z-axis direction and the X-axis direction of the base 220.

The fourth example EX4 is an example of combination in which the X-axis direction, the Y'-axis direction and the Z'-axis direction of the crystal element 130 are parallel to the Y-axis direction, the Z-axis direction and the X-axis direction of the lid 210, while the X-axis direction, the Y'-axis direction and the Z'-axis direction of the crystal element 130 are parallel to the X-axis direction, the Z-axis direction and the Y-axis direction of the base 220.

In four examples illustrated in FIG. 12, the X-axis and Z'-axis directions of the crystal element 130 are parallel to the X-axis and Y-axis directions of the lid 210 and base 220. The thermal expansion coefficient of the crystal material in the X-axis direction is higher than the thermal expansion coefficient in the Z'-axis direction, and as shown in FIG. 5, the thermal expansion coefficient of the crystal material are same in the X-axis and Y-axis directions. Thus, in the crystal device 200, the thermal expansion coefficient between the crystal element 130 and the lid 210 or the base 220 differs in the Z'-axis direction. Also, since the thermal expansion coefficients are the same in the X-axis and Y-axis directions, the axial direction of the lid 110 and the base 220 can be formed in a variety of directions, as shown in the first example EX1 to the fourth example EX4.

The crystal device 200 can be manufactured by following the flow-chart as shown in FIG. 6. A step for using the bonding material 140 in steps S104 and S105 is explained based on the component of first example EX1 in FIG. 12 and using FIGS. 13 and 14 as references.

Figure 13A:
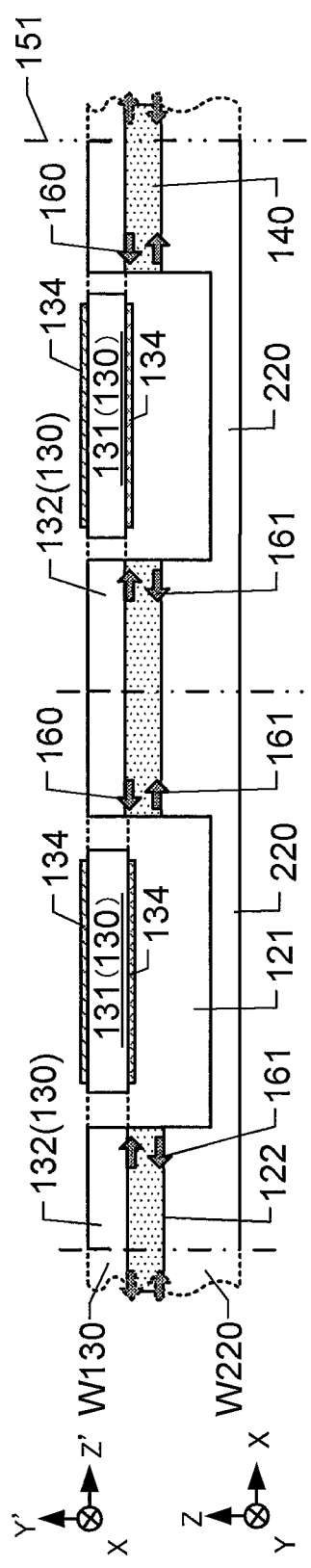
FIG. 13A is a cross-sectional view of the bonded-together crystal wafer W130 and the base wafer W220 in the Z'-axis direction.

FIG. 13A is a cross-sectional view of the bonded-together crystal wafer W130 and the base wafer W220 in the Z'-axis direction. On the base wafer W220, a plurality of bases 220 is formed and is fabricated from a Z-cut crystal material as a base material. FIG. 13A shows a bonding step of step S104 in FIG. 6 for bonding the crystal wafer and the base wafer using the bonding material 140, and FIG. 13A is a cross-sectional view along the line D-D in FIG. 7. The crystal wafer W130 and the base wafer W120 are aligned so that the surface of the frame 132 at the −Y'-axis side is overlapped to the bonding surface 122 and the Z'-axis of the crystal wafer W130 and the X-axis of the base wafer W220 to be parallel with each other, and are bonded together using the bonding material 140.

As explained in FIG. 10A, in FIG. 13A, during the cooling process of the wafer, a tensile stress 160 is applied on the bonding surface between the bonding material 140 and the crystal wafer W130 in the Z'-axis direction of the crystal device 200. Also, since the Z'-axis direction of the crystal device 200 is the X-axis direction of the base wafer W220, a compressional stress 161 is applied on the bonding surface between the bonding material 140 and the base wafer W220.

Figure 13B:
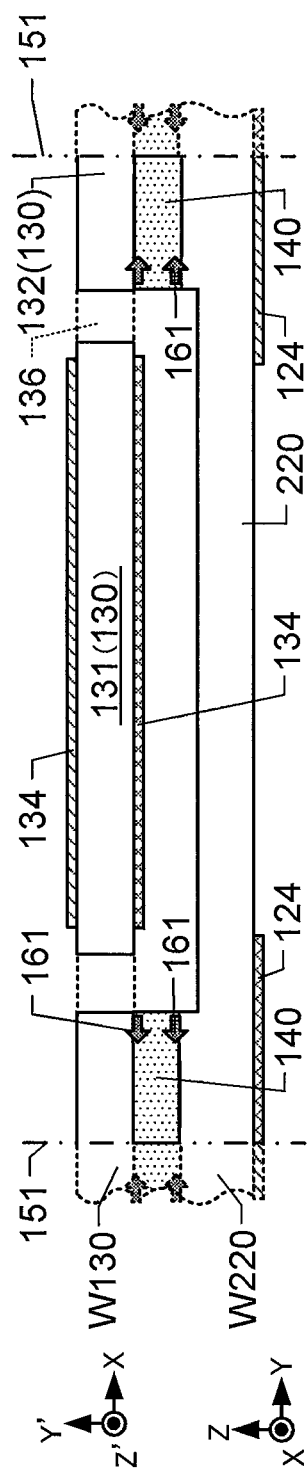
FIG. 13B is a cross-sectional view of the bonded-together crystal wafer W130 and the base wafer W220 in the X-axis direction.

FIG. 13B is a cross-sectional view of the bonded-together crystal wafer W130 and the base wafer W220 in the X-axis direction. FIG. 13B is a cross-sectional view of FIG. 7 taken along the E-E line. As explained in FIG. 10B, during the cooling process of the wafer, a compressional stress 160 is generated on the bonding surface between the bonding material 140 and the crystal wafer W130 across the X-axis direction of the crystal device 200. Also, since the thermal expansion coefficient of the crystal material is the same in the X-axis and Y-axis directions, compressional stress 161 generated on the bonding surface between the bonding material 140 and the base wafer W220 is same with the compressional stress generated on the bonding surface between the bonding material 140 and the crystal wafer W130.

FIG. 14A is a cross-sectional view of the bonded-together crystal wafer W130 and the lid wafer W210 in the Z'-axis direction. A plurality of lids 210 is formed on the lid wafer W210 and is fabricated by a Z-cut crystal material as a base material. FIG. 14A is also a cross-sectional view of FIG. 7 taken along the line D-D. FIG. 14A explains a bonding step of the step S105 in FIG. 7 for bonding the crystal wafer and the lid wafer using the bonding material 140. The crystal wafer W130 and the lid wafer W210 are bonded using the bonding material 140. The bonding method in step S105 is similar to the bonding step S104 of bonding the crystal wafer W130 and the base wafer W120 explained in FIG. 10A. Since the thermal expansion coefficient of the bonding material 140 is larger than the thermal expansion coefficient of the crystal material in the Z'-axis direction, the bonding material 140 tends to shrink more in comparison to the crystal material in the Z'-axis direction. Thus, the bonding surface between the bonding material 140 and the crystal element 130 is subjected to a tensile stress 160 formed by the crystal element 130 pulling the bonding material 140 in the Z'-axis direction. The tensile stress 160 pulls the bonding material 140 in the Z'-axis direction. Since the thermal expansion coefficient of the bonding material 140 is smaller than the thermal expansion coefficient of the crystal material in the X-axis direction, the bonding material 140 tends to shrink less in comparison to the crystal material in the X-axis direction. Thus, the bonding surface between the bonding material 140 and the lid 210 is subjected to a compressional stress 161 formed by the lid 210 compressing the bonding material 140 in the X-axis direction. The compressional stress 161 compresses the bonding material 140 toward the X-axis directions.

FIG. 14B is a cross-sectional view of the bonded-together crystal wafer W130 and the lid wafer W210 in the X-axis direction. FIG. 14B is also a cross-sectional view of FIG. 7 taken along the line E-E. As explained in FIG. 13B, since the thermal expansion coefficient of the bonding material 140 applied on the crystal device 200 is smaller than the thermal expansion coefficient of the crystal material in the X-axis and Y-axis directions, the bonding material 140 tends to shrink less than the crystal material in the X-axis and Y-axis directions of the crystal material. Thus, the bonding surface between the crystal element 130 and the bonding material 140 and the bonding surface between the lid 210 and the bonding material 140 are subjected a compressional stress 161 formed by the crystal element 130 and the lid 210 compressing the bonding material 140 in the X-axis direction of the crystal device 200. The compressional stress 161 compresses the bonding material 140 toward the X-axis direction of the crystal device 200.

Although FIGS. 13A, 13B, 14A, 14B were explained using the first example EX1 of FIG. 12 as reference, it can be applied to any one of the second example EX2 to fourth example EX4. Also, the base and the lid can be fabricated by a glass material. In this case, the glass material preferably has a thermal expansion coefficient between the thermal expansion coefficient in the X-axis and Z'-axis directions of the crystal element.

Although the preferred embodiments of the present invention have been described in detail above, as evident to those skilled in the art, these embodiments may be carried out by means of a variety of changes and modifications within the technical scope of the invention.

For example, although optimal embodiments of this present disclosure were explained using low-melting-point glass as bonding material, the bonding material can be replaced with resin, such as polyimide resin. In this case, thermal expansion coefficient of the polyimide resin is preferably between the thermal expansion coefficient in the longitudinal direction of crystal element and the thermal expansion coefficient in short-edge direction of the crystal material, which is similar to the embodiments above. When mounting the crystal device onto the printed substrate, heat may be applied onto the crystal device. In such case, damage to the sealing of the cavity due to the peeling of the bonding material can be prevented by having thermal expansion coefficient of the polyimide resin between the thermal expansion coefficient in longitudinal direction of the crystal element and the thermal expansion coefficient in short-edge direction of the crystal element.

Also, although optimal embodiments of the present disclosure were explained using an AT-cut crystal material as crystal element, the crystal element may be replaced with a Z-cut crystal material or BT-cut crystal material. Furthermore, the crystal element of the present invention may be constructed by employing a piezoelectric material containing lithium tantalite, lithium niobate or piezoelectric ceramic instead of the crystal material.

What is claimed is:

1. A crystal device, comprising:
    a crystal element, having a first rectangular shape, formed by a crystal material, and comprising an excitation part that vibrates when a voltage is applied and a frame that surrounds a periphery of the excitation part, the frame comprising first edges respectively along a first direction and a second direction intersecting with the first direction;
    a base, having a second rectangular shape, bonded to a principal surface of the frame, and comprising second edges respectively along the first direction and the second direction; and
    a lid, having a third rectangular shape, bonded to another principal surface of the frame and comprising third edges respectively along the first direction and the second direction;
    wherein a bonding material is applied having a thermal expansion coefficient between a thermal expansion coefficient in the first direction of the crystal element and a thermal expansion coefficient in the second direction of the crystal element.

2. The crystal device of claim 1, wherein the crystal material is an AT-cut crystal material, and the base and the lid are constituted with the AT-cut crystal material, a Z-cut crystal material or a glass material.

3. The crystal device of claim 1, wherein the crystal material is the Z-cut crystal material, and the base and the lid are constituted with an AT-cut crystal material, the Z-cut crystal material or a glass material.

4. The crystal device of claim 1, wherein the bonding material is a polyimide resin or a glass with a melting point of 500° C. or lower.

5. The crystal device of claim 2, wherein the bonding material is a polyimide resin or a glass with a melting point of 500° C. or lower.

6. The crystal device of claim 3, wherein the bonding material is a polyimide resin or a glass with a melting point of 500° C. or lower.

7. The crystal device of claim 4, wherein the thermal expansion coefficient of the bonding material is between 10.5-13 ppm/° C. at a temperature between an ambient temperature and 200° C.

* * * * *